United States Patent [19]

Idogawa et al.

[11] Patent Number: 5,051,703

[45] Date of Patent: Sep. 24, 1991

[54] FM DEMODULATOR WITH TRACKING FILTER

[75] Inventors: Kazuhiro Idogawa; Kiyoshi Amazawa, both of Tokyo, Japan

[73] Assignee: Clarion Co., Ltd., Tokyo, Japan

[21] Appl. No.: 538,124

[22] Filed: Jun. 14, 1990

[30] Foreign Application Priority Data

Jun. 30, 1989 [JP] Japan .................................. 1-170788

[51] Int. Cl.⁵ .............................................. H04B 1/10
[52] U.S. Cl. ..................................... 329/319; 329/321; 455/307; 455/309; 455/312
[58] Field of Search ............... 329/315, 318, 319, 321, 329/325, 344; 455/214, 205, 208, 210, 307, 309, 312

[56] References Cited

U.S. PATENT DOCUMENTS

| 4,035,730 | 7/1977 | Clayton | 329/321 X |
| 4,458,207 | 7/1984 | Favreau et al. | 329/319 |
| 4,816,770 | 3/1989 | Naumann | 329/318 |

Primary Examiner—Siegfried H. Grimm
Attorney, Agent, or Firm—Flynn, Thiel, Boutell & Tanis

[57] ABSTRACT

An FM demodulating circuit using a tracking filter is disclosed, in which the operation of the tracking filter following the frequency of the signal inputted therein is made more precise by using the tracking filter and an oscillator driven by a same control signal.

6 Claims, 4 Drawing Sheets

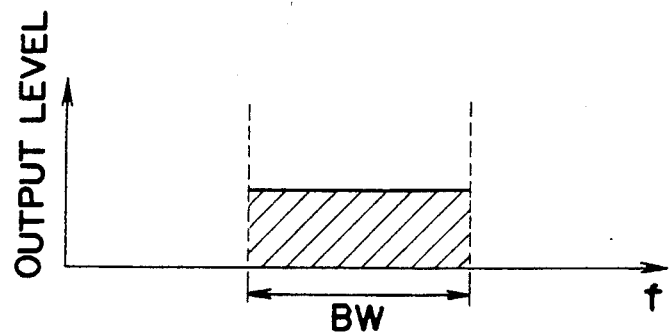
FIG. 5①
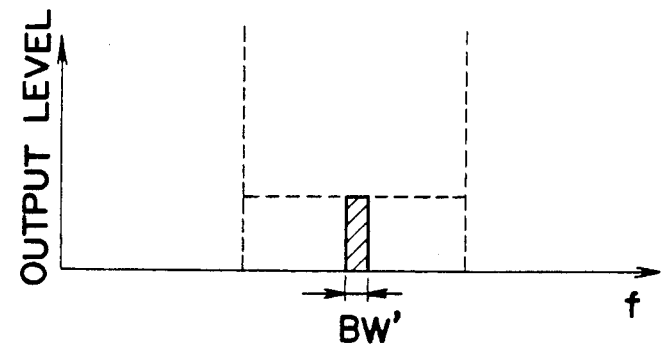
FIG. 5②
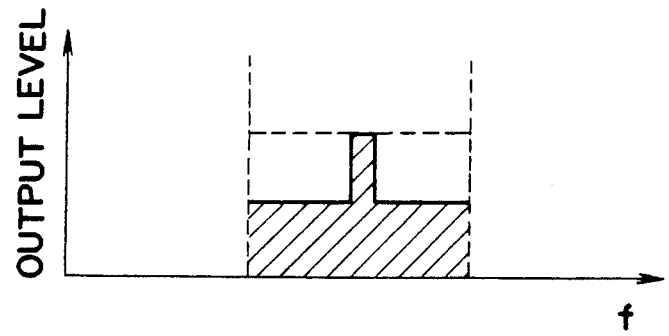
FIG. 5③

FM DEMODULATOR WITH TRACKING FILTER

FIELD OF THE INVENTION

The present invention relates to an FM demodulating circuit and in particular to an improvement for improving noise elimination by increasing the following speed of a tracking filter used in the demodulating circuit.

BACKGROUND OF THE INVENTION

In order to improve the S/N ratio in an FM demodulating system, heretofore a narrow band tracking filter, whose central frequency is made to follow the instantaneous frequency of the FM wave, has been used. FIG. 4 shows an example of the prior art FM demodulating system and FIG. 5 indicates noise distribution in the output signal of different parts thereof. In FIG. 4, reference numeral 1 is a 90° phase shift circuit (differentiation circuit); 2 is a limiter; 3 is a phase comparator; 4 is a loop filter (LPF); 5 is a narrow band tracking filter; and 6 is a limiter. The FM signal frequency-converted into the intermediate frequency by the front end is advanced in the phase by $\pi/2$ by the differentiation circuit 1 and the amplitude variable component is removed therefrom by the limiter 2. Therefore it is inputted in the phase comparator 3 through one input terminal as the reference signal for the phase comparison. Further, the FM signal stated above is inputted in the narrow band tracking filter 5, whose central frequency follows the instantaneous frequency of the inputted FM signal. The signal is inputted in the phase comparator 3 through the other input terminal through the limiter 6 after having removed noise outside of the relevant frequency band by means of the narrow band tracking filter 5. Then a phase error signal is obtained by the phase comparator 3. The phase error signal thus obtained is inputted in the loop filter 4 and outputted from the loop filter 4 as the demodulated signal. In addition, the demodulated signal thus obtained is used as a control signal for the narrow band tracking filter 5.

In the prior art system described above, since the narrow band tracking filter 5 passes only the signal in a frequency band having the necessary instantaneous spectral width of the FM signal, the noise outside of the band can be completely removed (FIG. 5, in which BW' represents the band width of the tracking filter 5). However the signal passing through the differentiation circuit 1 and the limiter 2, from which noise is not removed, is inputted in the phase comparator as it is (FIG. 5, in which BW represents the band width of the IF filter). That is, since noise is removed only from the signal coming from the limiter 4 in the two signals inputted in the phase comparator 3, the noise removal in the sum of the two signals, which have passed through the limiters 2 and 4, is a half (6 dB) outside of the pass band of the narrow band tracking filter 5 (FIG. 5). No noise is removed within the ass band of the narrow band tracking filter 5 (FIG. 5). Consequently the prior art system had a drawback that improvement relating to the noise is about a half (6 dB) and that the S/N ratio is not improved satisfactorily.

OBJECT OF THE INVENTION

Therefore the object of the present invention is to remove noise more satisfactorily by making the frequency following operation of the tracking filter more precise.

SUMMARY OF THE INVENTION

In order to achieve the above object, an FM demodulating circuit according to the present invention is characterized in that it comprises a tracking filter, whose central frequency follows an input FM signal; demodulating means for obtaining a demodulated output by detecting the signal through the tracking filter; control means for comparing the phase of the signal through the tracking filter described above with another input to generate a control signal applied to the control terminal of the tracking filter described above; an oscillator, whose oscillation is controlled by the control signal; and a phase shift circuit for shifting the phase of the output signal of the oscillator by a predetermined amount to obtain the another input described above.

Since the output phases of the tracking filter and the oscillator are controlled, the correlation between the input and the output of the tracking filter, i.e. the frequency following operation thereof is made more precise and thus the noise removing effect thereof is increased.

BRIEF DESCRIPTION OF THE DRAWINGS

FIG. 5 indicates noise distribution in the output signal in different parts of the circuit indicated in FIG. 4.

DETAILED DESCRIPTION

Figure 1:
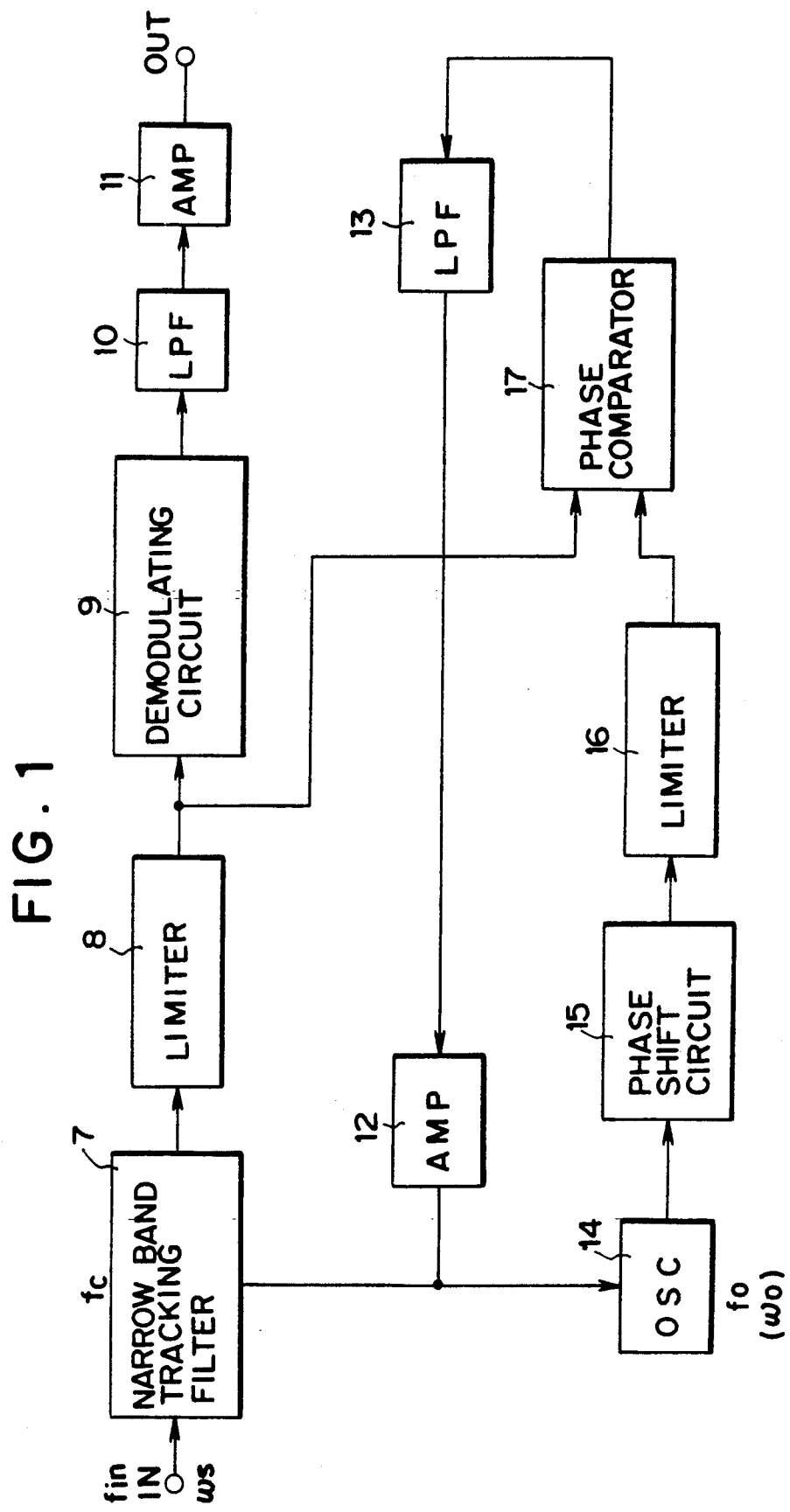
FIG. 1 is a block diagram illustrating an embodiment of the present invention.

Hereinbelow the present invention will be explained, referring to the drawings. FIG. 1 shows an embodiment of the FM demodulating circuit according to the present invention, in which reference numeral 7 is a narrow band tracking filter; 8 is a limiter; 9 is a demodulating circuit; 10 is a low pass filter; 11 and 12 are amplifiers; 13 is a low pass filter; 14 is an oscillator; 15 is a 90° phase shift circuit such as a differentiation circuit, etc.; 16 is a limiter; and 17 is a phase comparator.

In FIG. 1, an input FM signal frequency-converted into an intermediate frequency by the front end is inputted in the narrow band tracking filter 7, whose central frequency follows the instantaneous frequency thereof. The frequency variable component therein is removed by the limiter 8 after having removed noise outside of the frequency band and the remaining signal is inputted in the demodulating circuit 9. The signal discriminated in the frequency is outputted through the low pass filter 10 and the amplifier 11 as the demodulated signal. Further, the output signal of the limiter 8 is inputted in the phase comparator 17 through one input terminal thereof. The output signal of the oscillator 14 oscillating in the same frequency as the instantaneous frequency $f_0$ of the inputted FM signal is inputted in the phase comparator 17 through the other input terminal after having advanced the phase by 90° by means of the 90° phase shift circuit 15 and removed the frequency variable component by means of the limiter 16. The phase comparator 17 detects the phase difference between the two input signals and outputs an output DC voltage, depending on the phase state described below, which is given to the narrow band tracking filter 7 and the oscillator 14 through the low pass filter 13 and amplifier 12 to control the respective frequency. Here, at first, it is supposed that, in the case where the input is not modulated, the input FM signal is represented by $\cos 2\pi f_s t$, the output of the tracking filter 7 by $\cos(2\pi f_s t + \theta_1)$ and the output of the oscillator by $\cos(2\pi f_0 t + \theta_2)$, the output of $v_0$ of the phase comparator 17 is given by the following equation;

$$v_0 = \cos(2\pi f_s t + \theta_1) \cdot \cos\left(2\pi f_0 t + \theta_2 - \frac{\pi}{2}\right) \quad (1)$$

$$= -\sin(2\pi f_0 t + \theta_2) \cdot \cos(2\pi f_s t + \theta_1)$$

$$= -\frac{1}{2} \sin\{2\pi(f_0 + f_S)t + \theta_1 + \theta_2\} -$$

$$\frac{1}{2} \sin\{2\pi(f_0 - f_S)t + \theta_1 - \theta_2\}$$

where $\theta_1$ represents the phase variation by the tracking filter 7 and $\theta_2$ is the initial phase of the oscillator.

In Equation (1), supposing $f_0 = f_s$ and making the signal pass through the low pass filter 13, since the first term of the right member is cut off by the low pass filter 13, the control voltage $V_0$ is given by;

$$V_0 = -\frac{1}{2} \sin(\theta_2 - \theta_1) \quad (2)$$

In FIG. (2), $$\begin{cases} \text{for } \theta_2 = \theta_1 & V_0 = 0 \\ \text{for } \theta_2 > \theta_1 & V_0 \quad \text{a negative voltage} \\ \text{for } \theta_2 < \theta_1 & V_0 \quad \text{a positive voltage} \end{cases}$$

is applied to the narrow band tracking filter 7 and the oscillator 14 to control the respective frequency in a same mode. When the frequency of the inputted FM signal is in accordance with the central frequency of the narrow band tracking filter by this operation and their phases are in agreement with each other, the control described above is stopped.

Figure 2:
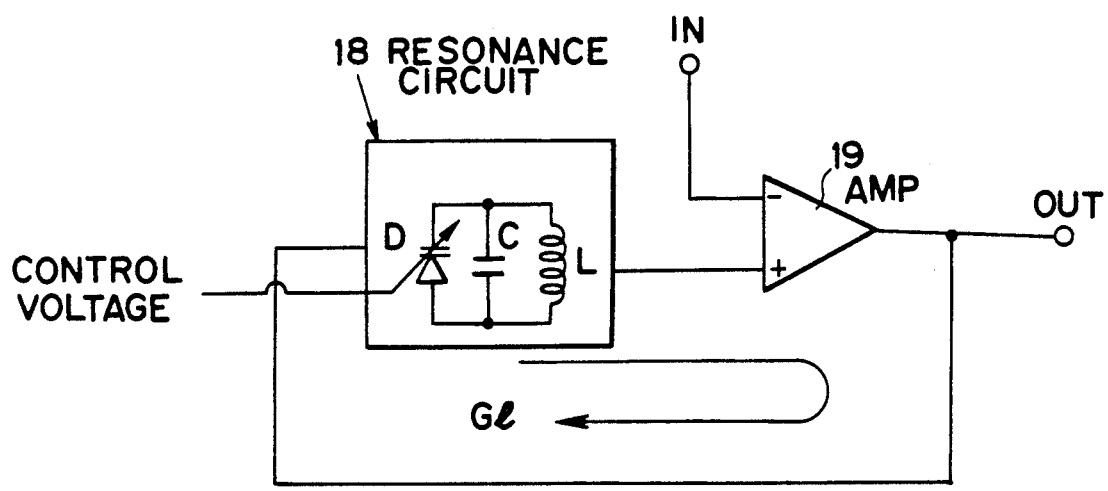
FIG. 2 is a scheme showing an example of the construction of the narrow band tracking filter and the oscillator.

Here the oscillator 14 and the narrow band tracking filter 7 are each composed of e.g. an LC resonance circuit 18 and a positive feedback circuit including a positive feedback amplifier 19, as indicated in FIG. 2. Now, representing the loop gain of feedback by Gl, the value of Gl can be used separately as follows. At this time, in the case where it is used as the oscillator, the input terminal IN in FIG. 2 is omitted. On the other hand, in the case where it is used as the tracking filter, the input FM signal is applied to the input terminal IN.

$$\begin{cases} Gl < 1 & \text{narrow band filter (resonance circuit having a large } Q) \\ Gl > 1 & \text{oscillator} \end{cases}$$

Figure 3:
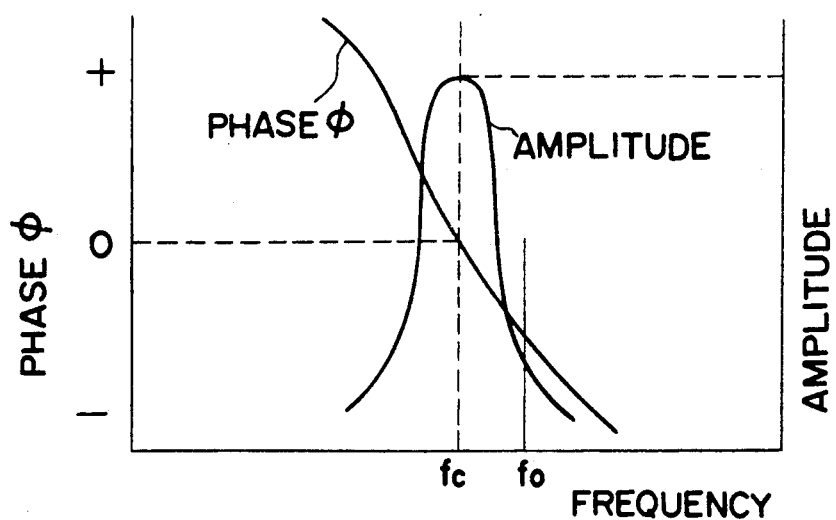
FIG. 3 is a scheme showing amplitude-phase characteristics of the filter.
Figure 4:
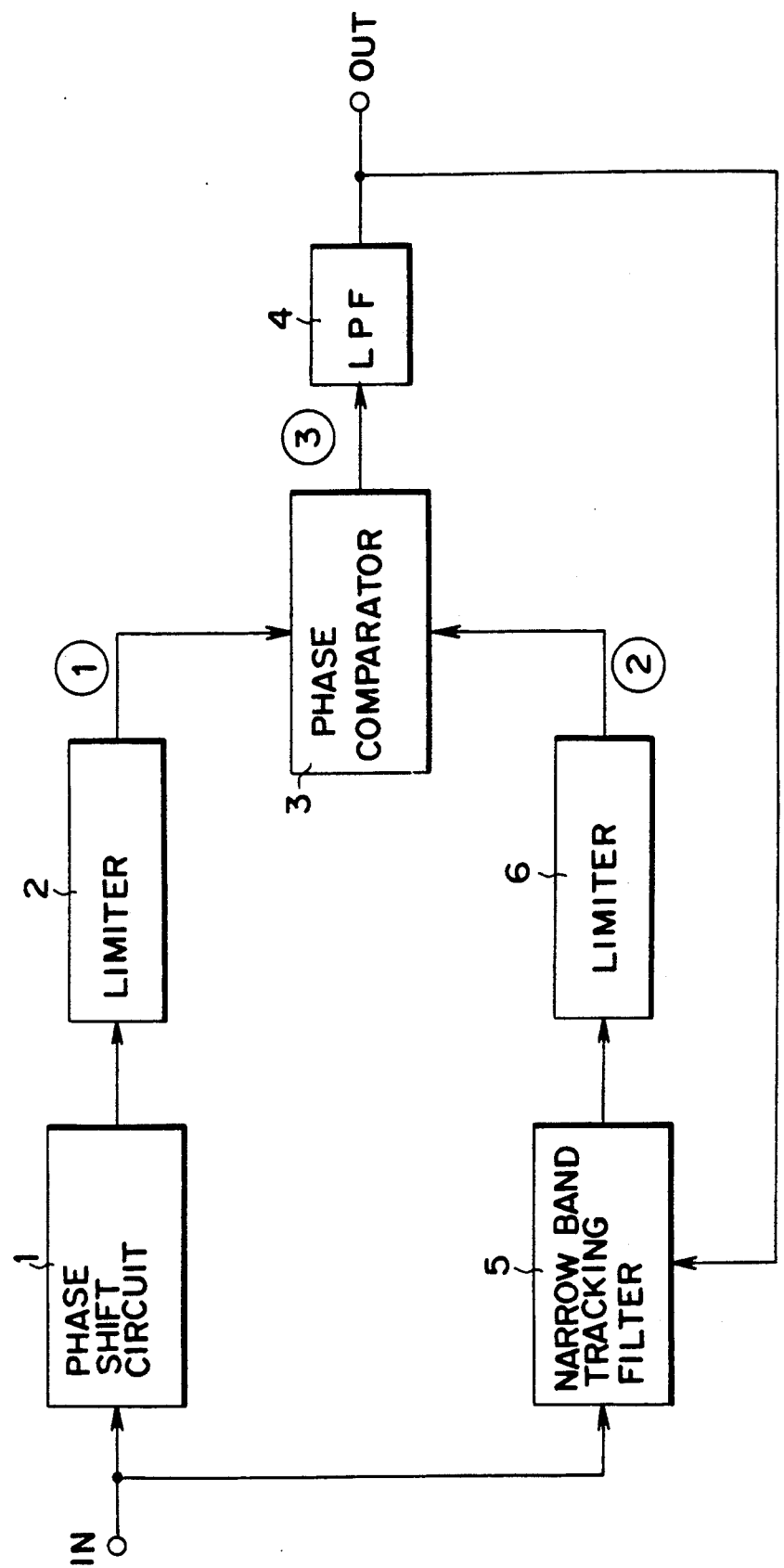
FIG. 4 is a block diagram illustrating a prior art FM demodulating circuit.

Further, in order that the oscillation frequency $f_0$ and the central frequency $f_c$ of the narrow band filter are in agreement with each other by using a same control voltage, the LC resonance circuit elements are composed of elements having a same construction so as to obtain a good correlation. In order to vary the oscillation frequency $f_0$ and the central frequency $f_c$ of the filter, a variable capacitance diode D is used for C in LC and the resultant capacitance is varied by using the control voltage. FIG. 3 shows the amplitude-phase characteristics of the narrow band tracking filter. In the figure, when the inputted FM signal is modulated and the instantaneous frequency thereof is higher than the central frequency of the tracking filter, the phase of the output of the narrow band tracking filter 7 is retarded with respect to the phase of the inputted signal. However, since the phase is advanced with respect to the phase of the carrier signal, the phase state by $f_0 > f_c$ is expressed by $\theta_2 < \theta_1$ in the relation between $\theta_2$ and $\theta_1$ described above. Consequently a positive voltage is applied as the control voltage to the diode stated above. Therefore, since a positive voltage is applied to the variable capacitance diodes D in the narrow band tracking filter 7 and the oscillator 14, the capacitance C thereof is decreased so that the central frequency of the filter and the oscillation frequency are raised. In this way, the delay in the phase by the filter is decreased, the instantaneous frequency of the inputted signal and the central frequency of the filter are in accordance with each other, the phases thereof are in agreement with each other, and the control operation is stopped. On the other hand, when the instantaneous frequency is lower than the carrier frequency, by an operation reverse to that described above, the central frequency $f_c$ is fixed at a value, which is equal to the instantaneous frequency of the inputted FM signal. In this way, a precise following operation of the narrow band tracking filter is made possible by this system.

By the method described above the noise outside of the relevant band is removed by the narrow band tracking filter 7. Further, since the output of the filter and the output of the oscillator (signal having a low noise level) are inputted for the control signal, an operation slightly influenced by noise is obtained and a remarkable improvement in the S/N ratio in the FM demodulation is achieved.

Furthermore, also if an integration circuit is used for the 90° phase shift circuit 15 in the system described above, a similar operation is obtained. Still further, also if a differentiation circuit is used for the 90° phase circuit 15 and the amplifier 12 is changed to an inverting amplifier, a similar operation is possible.

As explained above, according to the present invention, since the central frequency of the narrow band tracking filter follows the instantaneous frequency of the inputted signal more precisely, the demodulated output distortion due to the delay in the following operation is reduced. Further, since the noise outside of the relevant band is removed by the filter stated above, the improvement in the S/N ratio is remarkable. Further, since the selection characteristics are improved, good characteristics can be obtained, even if there is disturbance in the neighborhood of the relevant frequency.

What is claimed is:

1. An FM demodulating circuit comprising:
    a tracking filter, whose central frequency follows an input FM signal;
    demodulating means for obtaining a demodulated output by detecting the signal through the tracking filter;
    control means for comparing the phase of the signal through said tracking filter with another input to generate a frequency control signal applied to the control terminal of said tracking filter;

an oscillator, whose oscillation is controlled by the control signal; and a phase shift circuit for shifting the phase of the output signal of said oscillator by a predetermined amount to obtain said another input applied to said control means.

2. An FM demodulating circuit according to claim 1, wherein said tracking filter consists of a resonance circuit and a positive feedback amplifier.

3. An FM demodulating circuit according to claim 2, wherein said resonance circuit includes a variable capacitance diode.

4. An FM demodulating circuit according to claim 1, wherein said oscillator consists of a resonance circuit and a positive feedback amplifier.

5. An FM demodulating circuit according to claim 4, wherein said resonance circuit includes a variable capacitance diode.

6. An FM demodulating circuit according to claim 1, wherein said phase shift circuit is a differentiation circuit.

* * * * *